(12) United States Patent
Ahn et al.

(10) Patent No.: US 11,629,397 B2
(45) Date of Patent: Apr. 18, 2023

(54) MASK ASSEMBLY, APPARATUS, AND METHOD OF MANUFACTURING DISPLAY DEVICE

(71) Applicant: Samsung Display Co., Ltd., Yongin-si (KR)

(72) Inventors: Hongkyun Ahn, Yongin-si (KR); Euigyu Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 428 days.

(21) Appl. No.: 16/878,340

(22) Filed: May 19, 2020

(65) Prior Publication Data
US 2021/0108303 A1 Apr. 15, 2021

(30) Foreign Application Priority Data
Oct. 15, 2019 (KR) .................. 10-2019-0127871

(51) Int. Cl.
| H01L 51/00 | (2006.01) |
| C23C 14/04 | (2006.01) |
| C23C 14/34 | (2006.01) |
| H01L 51/56 | (2006.01) |
| H01L 27/32 | (2006.01) |

(52) U.S. Cl.
CPC ............ *C23C 14/042* (2013.01); *C23C 14/34* (2013.01); *H01L 51/0011* (2013.01); *H01L 51/56* (2013.01); *H01L 27/3244* (2013.01); *H01L 2227/323* (2013.01)

(58) Field of Classification Search
CPC ... C23C 14/042; C23C 14/34; H01L 51/0011; H01L 51/56; H01L 2227/323
See application file for complete search history.

(56) References Cited

U.S. PATENT DOCUMENTS

| 8,286,579 | B2 | 10/2012 | Sung et al. |
| 8,550,032 | B2 | 10/2013 | Park |
| 8,869,738 | B2 | 10/2014 | Shin et al. |
| 10,128,440 | B2 | 11/2018 | Lee et al. |
| 10,344,376 | B2 | 7/2019 | Hong |
| 2013/0077173 | A1* | 3/2013 | Wang ............... G02F 1/136209 |
| | | | 156/251 |

(Continued)

FOREIGN PATENT DOCUMENTS

| KR | 10-0903624 B1 | 6/2009 |
| KR | 10-0971753 B1 | 7/2010 |

(Continued)

*Primary Examiner* — Jaehwan Oh
(74) *Attorney, Agent, or Firm* — Lewis Roca Rothgerber Christie LLP

(57) ABSTRACT

A mask assembly, an apparatus for manufacturing a display device, and a method of manufacturing a display device are provided. A mask assembly includes: a mask frame including a frame body portion and dividers, the frame body portion being arranged at an outside of the mask frame, and the dividers dividing an inside of the frame body portion into a plurality of openings, each of the dividers being connected in a first direction and a second direction; and a plurality of mask sheets arranged on a top surface of the mask frame, coupled to the mask frame, and including at least one pattern opening, mask sheets of the plurality of mask sheets being apart from each other in the first direction.

10 Claims, 15 Drawing Sheets

(56) References Cited

U.S. PATENT DOCUMENTS

2021/0135112 A1* 5/2021 Kim .................... H01L 51/001

FOREIGN PATENT DOCUMENTS

| KR | 10-1107159 B1 | 1/2012 |
| KR | 10-2017-0051819 A | 5/2017 |
| KR | 10-1759347 B1 | 8/2017 |
| KR | 10-1837624 B1 | 3/2018 |

* cited by examiner

MASK ASSEMBLY, APPARATUS, AND METHOD OF MANUFACTURING DISPLAY DEVICE

CROSS-REFERENCE TO RELATED APPLICATION

This application claims priority to and the benefit of Korean Patent Application No. 10-2019-0127871, filed on Oct. 15, 2019 in the Korean Intellectual Property Office, the entire disclosure of which is incorporated herein by reference.

BACKGROUND

1. Field

Aspects of embodiments relate to a mask assembly, an apparatus, and a method of manufacturing a display device.

2. Description of Related Art

A mobile electronic apparatus is widely used. As mobile electronic apparatuses, in addition to miniaturized electronic apparatuses, such as mobile phones, tablet personal computers (PC) are widely used recently.

To support various functions, mobile electronic apparatuses include a display device for providing visual information, such as an image, to a user. Recently, as parts for driving a display device are miniaturized, a portion occupied by the display device in the electronic apparatus is gradually increasing, and a structure that may be bent to have an angle (e.g., a predetermined angle) from a flat state is also under development.

The display device may include an intermediate layer including an organic emission layer. In this case, the sharpness of an image displayed by the display device may be determined by how precise a pattern of the intermediate layer is arranged.

SUMMARY

Generally, displaying a precise image may be determined by how precisely each layer of a display device is formed. In this case, it may be important how accurately an organic emission layer is arranged to correspond to a pixel electrode. According to aspects of embodiments of the present disclosure, a mask assembly, an apparatus and a method of manufacturing a display device, in which an intermediate layer having a precise pattern is formed, are provided.

Additional aspects will be set forth, in part, in the description which follows and, in part, will be apparent from the description, or may be learned by practice of the presented embodiments of the disclosure.

According to one or more embodiments, a mask assembly includes: a mask frame including a frame body portion and dividers, the frame body portion being arranged at an outside of the mask frame, and the dividers dividing an inside of the frame body portion into a plurality of openings, each of the dividers being connected in a first direction and a second direction, and a plurality of mask sheets arranged on a top surface of the mask frame, coupled to the mask frame, and including at least one pattern opening, mask sheets of the plurality of mask sheets being apart from each other in the first direction.

The dividers may include a first divider connected to the frame body portion and arranged in the first direction, and a second divider connected to the frame body portion and the first divider and arranged in the second direction.

A lateral side of a divider of the dividers may be tapered.

A width of one of a top surface and a bottom surface of a divider of the dividers may be less than a width of the other of the top surface and the bottom surface of the divider.

According to one or more embodiments, an apparatus for manufacturing a display device includes: a chamber in which a display substrate is to be arranged, a mask assembly arranged inside the chamber to face the display substrate, a deposition source arranged inside the chamber to face the mask assembly and supply a deposition material to the display substrate, wherein the mask assembly includes a mask frame including a frame body portion and dividers, the frame body portion being arranged at an outside of the mask frame, and the dividers dividing an inside of the frame body portion into a plurality of openings, each of the dividers being connected in a first direction and a second direction, and a plurality of mask sheets arranged on a top surface of the mask frame, coupled to the mask frame, and including at least one pattern opening, mask sheets of the plurality of mask sheets being apart from each other in the first direction.

The dividers may include a first divider connected to the frame body portion and arranged in the first direction, and a second divider connected to the frame body portion and the first divider and arranged in the second direction.

A lateral side of a divider of the dividers may be tapered.

A width of one of a top surface and a bottom surface of a divider of the dividers may be less than a width of the other of the top surface and the bottom surface of the divider.

According to one or more embodiments, a method of manufacturing a display device includes: arranging a mask frame including a frame body portion and dividers, the frame body portion being arranged at an outside of the mask frame, and the dividers dividing an inside of the frame body portion into a plurality of openings, each of the dividers being connected in a first direction and a second direction, arranging a first mask sheet member on the mask frame, the first mask sheet member including a first shield portion, and a first pattern portion in which at least one first pattern opening is arranged, fixing the first shield portion and the first pattern portion on the mask frame, removing the first shield portion, arranging a second mask sheet member including a second shield portion, and a second pattern portion in which at least one second pattern opening is arranged, such that the first pattern portion corresponds to the second shield portion, and the second pattern portion corresponds to the first shield portion, fixing the second shield portion and the second pattern portion on the mask frame, and removing the second shield portion.

The method may further include tensioning the first mask sheet member in a lengthwise direction of the first mask sheet member.

The method may further include tensioning the second mask sheet member in a lengthwise direction of the second mask sheet member.

A lateral side of a divider of the dividers may be tapered.

A width of one of a top surface and a bottom surface of a divider of the dividers may be less than a width of the other of the top surface and the bottom surface of the divider.

The first pattern portion and the second pattern portion may be arranged in a line in the first direction.

The first pattern portion may include a plurality of first pattern portions, and the first mask sheet member may be fixed on the mask frame such that the plurality of first pattern portions neighbor each other in the second direction.

The second pattern portion may include a plurality of second pattern portions, and the second mask sheet member may be fixed on the mask frame such that the plurality of second pattern portions neighbor each other in the second direction.

The first mask sheet member may be fixed on the mask frame by welding.

The second mask sheet member may be fixed on the mask frame by welding.

The above and other aspects, features, and advantages of certain embodiments of the disclosure will be more apparent from the following description, the accompanying drawings, and claims.

Aspects of embodiments of the present disclosure may be implemented by a system, a method, a computer program, or a combination of a system, a method, and/or a computer program.

BRIEF DESCRIPTION OF THE DRAWINGS

The above and other aspects, features, and advantages of certain embodiments of the disclosure will be more apparent from the following description, taken in conjunction with the accompanying drawings, in which.

DETAILED DESCRIPTION

Figure 1:
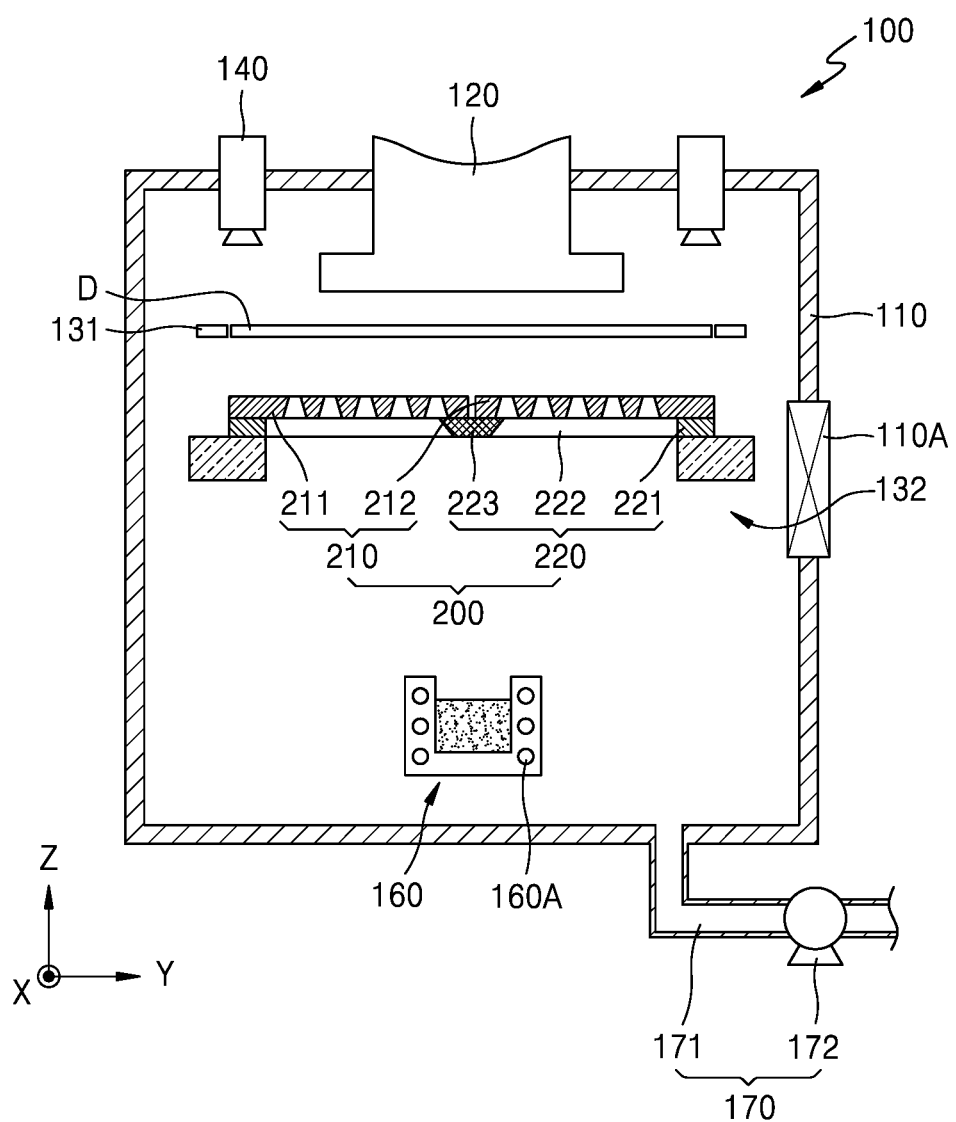
FIG. 1 is a cross-sectional view of an apparatus for manufacturing a display device according to an embodiment.

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

Herein, some embodiments are described in further detail with reference to the accompanying drawings. In the drawings, the same reference numerals are given to the same or corresponding elements, and repeated description thereof is omitted.

It is to be understood that although the terms "first," "second," etc. may be used herein to describe various components, these components should not be limited by these terms. These terms are used to distinguish one component from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

It is to be understood that when a layer, region, or component is referred to as being "formed on," another layer, region, or component, it may be directly or indirectly formed on the other layer, region, or component. That is, for example, one or more intervening layers, regions, or components may be present.

Sizes of elements in the drawings may be exaggerated for convenience of explanation. In other words, since sizes and thicknesses of components in the drawings may be arbitrarily illustrated for convenience of explanation, the following embodiments are not limited thereto.

In the following examples, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
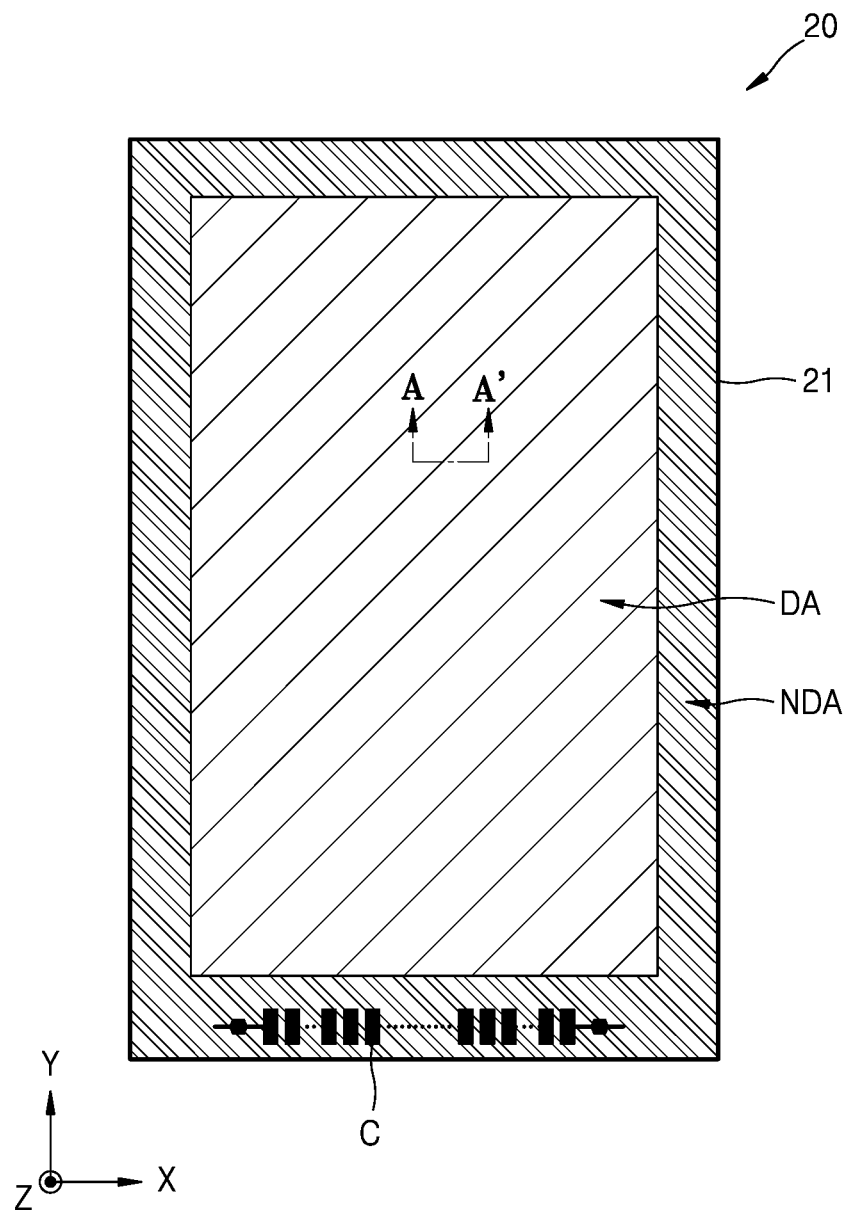
FIG. 2 is a plan view of a display device according to an embodiment.

FIG. 1 is a cross-sectional view of an apparatus 100 for manufacturing a display device, according to an embodiment. FIG. 2 is a plan view of a display device 20 according to an embodiment; and FIG. 3 is a cross-sectional view of the display device 20, taken along the line A-A' of FIG. 2.

Figure 3:
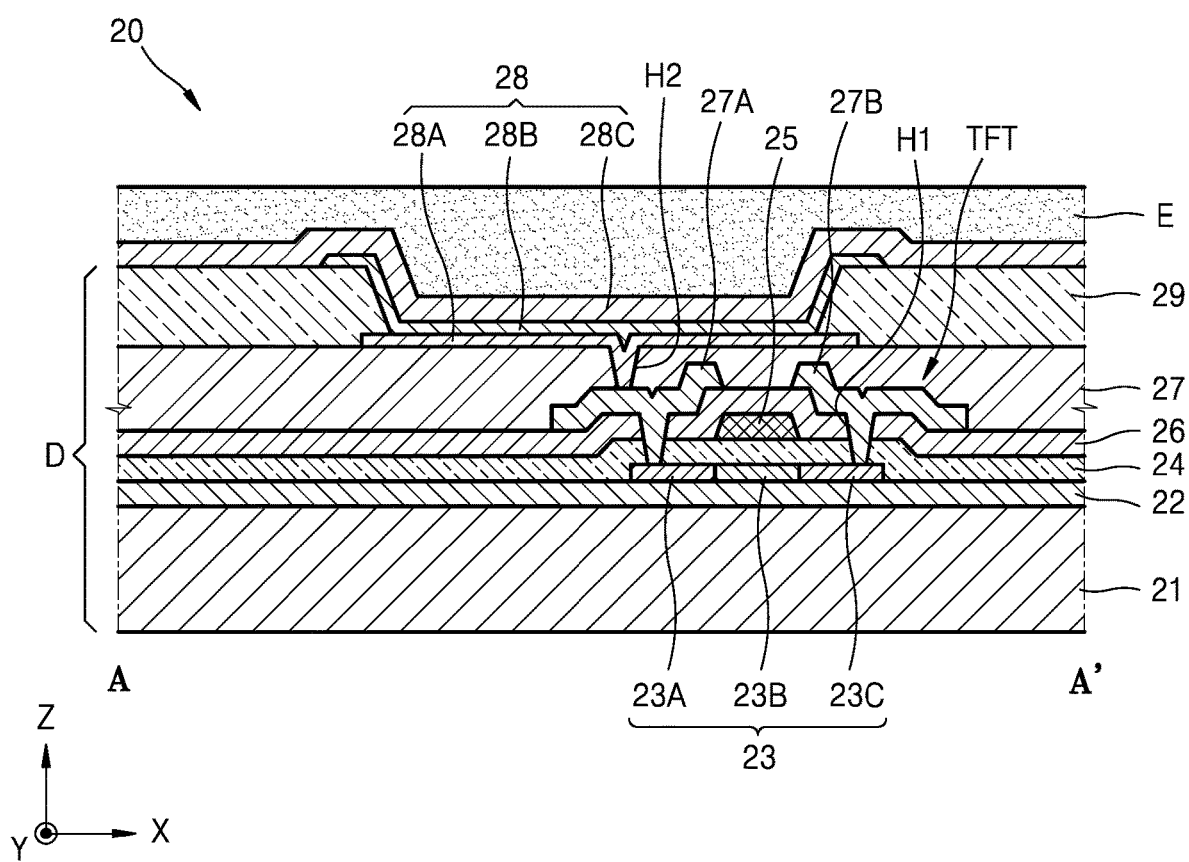
FIG. 3 is a cross-sectional view of the display device of FIG. 2, taken along the line A-A'.

Referring to FIGS. 1 to 3, the apparatus 100 for manufacturing a display device according to an embodiment includes a chamber 110, a magnetic force generator 120, a first supporter 131, a second supporter 132, a vision unit 140, a mask assembly 200, a deposition source 160, and a pressure adjuster 170.

The chamber 110 may include a space therein, and a portion of the chamber 110 may include an opening. A gate valve 110A may be installed to the opening of the chamber 110 to selectively open/close the opening of the chamber 110.

The magnetic force generator 120 may be fixed to the chamber 110. In this case, the magnetic force generator 120 may include at least one of an electromagnet and a permanent magnet to selectively generate a magnetic field. The magnetic force generator 120 may closely attach the mask assembly 200 toward a display substrate D.

The first supporter 131 may support the display substrate D. In this case, the first supporter 131 may variously support the display substrate D. For example, the first supporter 131 may include an electrostatic chuck or an adhesive chuck. In an embodiment, the first supporter 131 and the magnetic force generator 120 may be provided as one body or one unit. In an embodiment, the first supporter 131 may include a frame or a clamp, the frame supporting the display substrate D by seating a portion of the display substrate D thereon, and the clamp fixing the display substrate D by gripping a portion of the display substrate D. However, the first supporter 131 is not limited thereto and may include any suitable apparatus that may support the display substrate D. Herein, for convenience of description, a case in which the first supporter 131 includes a clamp gripping the display substrate D is mainly described in further detail.

The mask assembly 200 may be seated on and supported by the second supporter 132. In an embodiment, the second supporter 132 may fine-adjust the mask assembly 200 in at least two different directions.

The vision unit 140 may capture locations of the display substrate D and the mask assembly 200. In an embodiment, the display substrate D and the mask assembly 200 may be aligned by moving at least one of the display substrate D and the mask assembly 200 based on an image captured by the vision unit 140.

The mask assembly 200 may include a mask frame 220 and a mask sheet 210. In an embodiment, the mask frame 220 may include a frame body portion 221, a first divider 222, and a second divider 223. The mask sheet 210 may include a first mask sheet 211 and a second mask sheet 212. A deposition material may be inserted into or contained in the deposition source 160 and then may evaporate. In an embodiment, the deposition source 160 may include a heater 160A, and the deposition material may be evaporated by heat applied from the heater 160A.

The deposition source 160 may be formed in any of various types. For example, the deposition source 160 may be a point deposition source in which an entry thereof is formed in a circular shape, the deposition material being discharged through the entry. In an embodiment, the deposition source 160 may be a linear deposition source which is formed long and in which a plurality of entries are provided or an entry is provided in a long cavity shape. Herein, for convenience of description, a case in which the deposition source 160 is arranged to face a point of the mask assembly 200 and provided as a point deposition source is mainly described in further detail.

The pressure adjuster 170 may be connected to the chamber 110 to adjust an inner pressure of the chamber 110 to atmospheric pressure or vacuum. In an embodiment, the pressure adjuster 170 may include a connection pipe 171 and a pressure-adjusting pump 172, the connection pipe 171 being connected to the chamber 110, and the pressure-adjusting pump 172 being arranged on the connection pipe 171.

A method of manufacturing a display device by using the apparatus 100 for manufacturing the display device is described. The display substrate D is manufactured and prepared.

The pressure adjuster 170 may maintain the inside of the chamber 110 to be an atmospheric pressure state. The gate valve 110A is opened, and then the display substrate D and the mask assembly 200 that is transformation-corrected may be inserted into the chamber 110. In an embodiment, a separate robot arm, a shutter, etc. may be provided inside or outside the chamber 110 to transfer the display substrate D and the mask assembly 200.

The pressure adjuster 170 may maintain the inside of the chamber 110 to be similar to a vacuum or generally a vacuum. In an embodiment, at least one of the first supporter 131 and the second supporter 132 may operate to adjust an interval between the display substrate D and the mask assembly 200 to a certain interval (e.g., a predetermined interval). The vision unit 140 may capture the display substrate D and the mask assembly 200 to fine-drive the first supporter 131 and the second supporter 132, fine-adjust at least one of the display substrate D and the mask assembly 200, and align the display substrate D and the mask assembly 200.

The heater 160A may operate to supply the deposition material from the deposition source 160 to the mask assembly 200. The deposition material that passes through the mask assembly 200 may be deposited in a pattern (e.g., a predetermined pattern) on the display substrate D.

While the above process is performed, at least one of the deposition source 160 and the display substrate D may perform linear motion. In another embodiment, the deposition may be performed while both the deposition source 160 and the display substrate D are stationary. Herein, for convenience of description, a case in which the deposition is performed while both the deposition source 160 and the display substrate D are stationary is mainly described in further detail.

The deposition material supplied from the deposition source 160 as described above may pass through the mask assembly 200 and be deposited on the display substrate D to form at least one layer of an intermediate layer 28B. Then, a display device 20 may be manufactured by sequentially arranging an opposite electrode 28C and a thin-film encapsulation layer E on the intermediate layer 28B.

In the display device 20, a display area DA and a non-display area NDA outside the display area DA may be defined over a substrate 21. An emission portion may be arranged in the display area DA, and a power line (not shown) may be arranged in the non-display area NDA. A pad unit C may be arranged in the non-display area NDA.

In an embodiment, the display device 20 may include the display substrate D and an encapsulation member (not shown). In an embodiment, the display substrate D may include the substrate 21, a thin film transistor TFT, a passivation layer 27, and a pixel electrode 28A. In another embodiment, the display substrate D may include at least one of the substrate 21, the thin film transistor TFT, the passivation layer 27, the pixel electrode 28A, and the intermediate layer 28B. In an embodiment, the encapsulation member may include an encapsulation substrate (not shown) facing the substrate 21, and a sealing member (not shown) arranged between the substrate 21 and the encapsulation substrate. In an embodiment, an organic light-emitting diode 28 arranged over the substrate 21 may be sealed by the sealing member and the encapsulation substrate. In another embodiment, the encapsulation member may include the thin-film encapsulation layer E. Herein, for convenience of description, a case in which the display substrate D includes the substrate 21, the thin film transistor TFT, the passivation layer 27, and the pixel electrode 28A is mainly described in further detail. Also, for convenience of description, a case in which the encapsulation member includes the thin-film encapsulation layer E is mainly described in further detail.

The substrate 21 may include glass or a polymer resin. In an embodiment, the polymer resin may include a polyethersulfone, polyacrylate, polyetherimide, polyethylene naphthalate, polyethylene terephthalate, polyphenylene sulfide, polyarylate, polyimide, polycarbonate, or cellulose acetate propionate. In an embodiment, the substrate 21 including the polymer resin may be flexible, rollable, or bendable. In an embodiment, the substrate 21 may have a multi-layered structure including a layer including the above-described polymer resin and an inorganic layer (not shown).

The thin film transistor TFT may be formed over the substrate 21, the passivation layer 27 may be formed to cover the thin film transistor TFT, and the organic light-emitting diode 28 may be formed on the passivation layer 27.

A buffer layer 22 may be further formed on the substrate 21, the buffer layer 22 including an organic compound and/or an inorganic compound. The inorganic compound may include $SiO_x$ (x≥1) and $SiN_x$ (x≥1).

An active layer 23 arranged in a pattern (e.g., a predetermined pattern) is formed on the buffer layer 22, and then the active layer 23 is buried by a gate insulating layer 24. The active layer 23 includes a source region 23A and a drain region 23C, and a channel region 23B therebetween.

The active layer 23 may include any of various materials. For example, the active layer 23 may include an inorganic semiconductor material, such as amorphous silicon or crystalline silicon. As another example, the active layer 23 may include an oxide semiconductor. As another example, the active layer 23 may include an organic semiconductor material. Herein, for convenience of description, a case in which the active layer 23 includes amorphous silicon is mainly described in further detail.

In an embodiment, the active layer 23 may be formed by forming an amorphous silicon layer on the buffer layer 22, crystallizing the amorphous silicon layer into a polycrystalline silicon layer, and patterning the polycrystalline silicon layer. The source region 23A and the drain region 23C of the active layer 23 may be doped with impurities depending on a kind of a thin film transistor, such as a driving thin film transistor (not shown) and a switching thin film transistor (not shown).

A gate electrode 25 and an interlayer insulating layer 26 burying the gate electrode 25 are formed on a top surface of the gate insulating layer 24, the gate electrode 25 corresponding to the active layer 23.

Contact holes H1 are formed in the interlayer insulating layer 26 and the gate insulating layer 24, and then a source electrode 27A and a drain electrode 27B are formed on the interlayer insulating layer 26 to respectively contact the source region 23A and the drain region 23C through the contact holes H1.

The passivation layer 27 is formed on the thin film transistor TFT, and the pixel electrode 28A of the organic light-emitting diode 28 is formed on the passivation layer 27. The pixel electrode 28A contacts the source electrode 27A of the thin film transistor TFT through a via hole H2 formed in the passivation layer 27. The passivation layer 27 may include an inorganic material and/or an organic material and include a single layer or two or more layers. The passivation layer 27 may be formed as a planarized layer having a flat top surface regardless of the bending of a layer thereunder, or formed to be curved along the bending of a layer thereunder. In an embodiment, the passivation layer 27 includes a transparent insulator to accomplish a resonance effect.

After the pixel electrode 28A is formed on the passivation layer 27, a pixel-defining layer 29 is formed to cover the pixel electrode 28A and the passivation layer 27, the pixel-defining layer 29 including an organic material and/or an inorganic material. A portion of the pixel-defining layer 29 is open to expose the pixel electrode 28A.

The intermediate layer 28B and the opposite electrode 28C are formed on at least the pixel electrode 28A. In an embodiment, the opposite electrode 28C may be formed on an entire surface of the display substrate D. In this case, the opposite electrode 28C may be formed on the intermediate layer 28B and the pixel-defining layer 29. Herein, for convenience of description, a case in which the opposite electrode 28C is formed on the intermediate layer 28B and the pixel-defining layer 29 is mainly described in further detail.

In an embodiment, the pixel electrode 28A serves as an anode electrode, and the opposite electrode 28C serves as a cathode electrode. However, polarities of the pixel electrode 28A and the opposite electrode 28C may be reversed.

The pixel electrode 28A is insulated from the opposite electrode 28C by the intermediate layer 28B. The pixel electrode 28A and the opposite electrode 28C may apply different voltages to the intermediate layer 28B to allow light to be emitted from an organic emission layer.

The intermediate layer 28B may include the organic emission layer. As another example, the intermediate layer 28B may include an organic emission layer and may further include at least one of a hole injection layer, a hole transport layer, an electron transport layer, and an electron injection layer. However, the present disclosure is not limited thereto, and the intermediate layer 28B may include the organic emission layer and further include any of various functional layers (not shown).

In an embodiment, the intermediate layer 28B may be provided as a plurality of intermediate layers. The plurality of intermediate layers 28B may constitute the display area DA. In this case, the plurality of intermediate layers 28B may be apart from each other inside the display area DA.

One unit pixel may include a plurality of sub-pixels each emitting light having various colors. For example, the plurality of sub-pixels may include sub-pixels respectively emitting red light, green light, and blue light or include sub-pixels (not shown) respectively emitting red light, green light, blue light, and white light. Each sub-pixel may include the pixel electrode 28A, the intermediate layer 28B, and the opposite electrode 28C described above.

The apparatus 100 for manufacturing the display device may form various layers on the display substrate D. For example, the apparatus 100 for manufacturing the display device may form at least one layer of the intermediate layer 28B over the display substrate D. For example, the apparatus 100 for manufacturing the display device may form at least one of the organic emission layer, the hole injection layer, the hole transport layer, the electron injection layer, the electron transport layer, and a functional layer.

In an embodiment, the thin-film encapsulation layer E may include a plurality of inorganic layers or include an inorganic layer and an organic layer.

The organic layer of the thin-film encapsulation layer E may include a polymer-based material. The polymer-based material may include polyethylene terephthalate, polyethylene naphthalate, polycarbonate, polyimide, polyethylene sulfonate, polyoxymethylene, polyarylate, hexamethyldisiloxane, an acrylic resin (e.g. polymethylmethacrylate, a polyacrylic acid, etc.), or a combination thereof.

In an embodiment, the inorganic layer of the thin-film encapsulation layer E may include at least one inorganic insulating material among aluminum oxide, titanium oxide, tantalum oxide, hafnium oxide, zinc oxide, silicon oxide, silicon nitride, and silicon oxynitride.

An uppermost layer of the thin-film encapsulation layer E that is exposed to the outside may include an inorganic layer to prevent or substantially prevent moisture transmission of the organic light-emitting diode.

In an embodiment, the thin-film encapsulation layer E may include at least one sandwich structure in which at least one organic layer is arranged between at least two inorganic layers. As another example, the thin-film encapsulation layer E may include at least one sandwich structure in which at least one inorganic layer is arranged between at least two organic layers. As another example, the thin-film encapsulation layer E may include at least one sandwich structure in which at least one organic layer is arranged between at least two inorganic layers, and at least one sandwich structure in which at least one inorganic layer is arranged between at least two organic layers.

In an embodiment, the thin-film encapsulation layer E may include, sequentially from above the organic light-emitting diode 28, a first inorganic layer, a first organic layer, and a second inorganic layer.

As another example, the thin-film encapsulation layer E may include, sequentially from above the organic light-emitting diode 28, a first inorganic layer, a first organic layer, a second inorganic layer, a second organic layer, and a third inorganic layer.

As another example, the thin-film encapsulation layer E may include, sequentially from above the organic light-emitting diode 28, a first inorganic layer, a first organic layer, a second inorganic layer, a second organic layer, a third inorganic layer, a third organic layer, and a fourth inorganic layer.

In an embodiment, a halogenated metal layer may be additionally arranged between the organic light-emitting diode 28 and the first inorganic layer, the halogenated metal layer including LiF. The halogenated metal layer may prevent or substantially prevent the organic light-emitting diode 28 from being damaged while the first inorganic layer is formed by using a sputtering method.

In an embodiment, an area of the first organic layer may be less than an area of the second inorganic layer, and an area of the second organic layer may be less than an area of the third inorganic layer.

In a case in which the inorganic layer is provided as a plurality of inorganic layers, the inorganic layers may be deposited to directly contact each other in an edge region of the display device 20 and to prevent or substantially prevent the organic layer from being exposed to the outside.

Therefore, the display device 20 may display a fine image.

Figure 4:
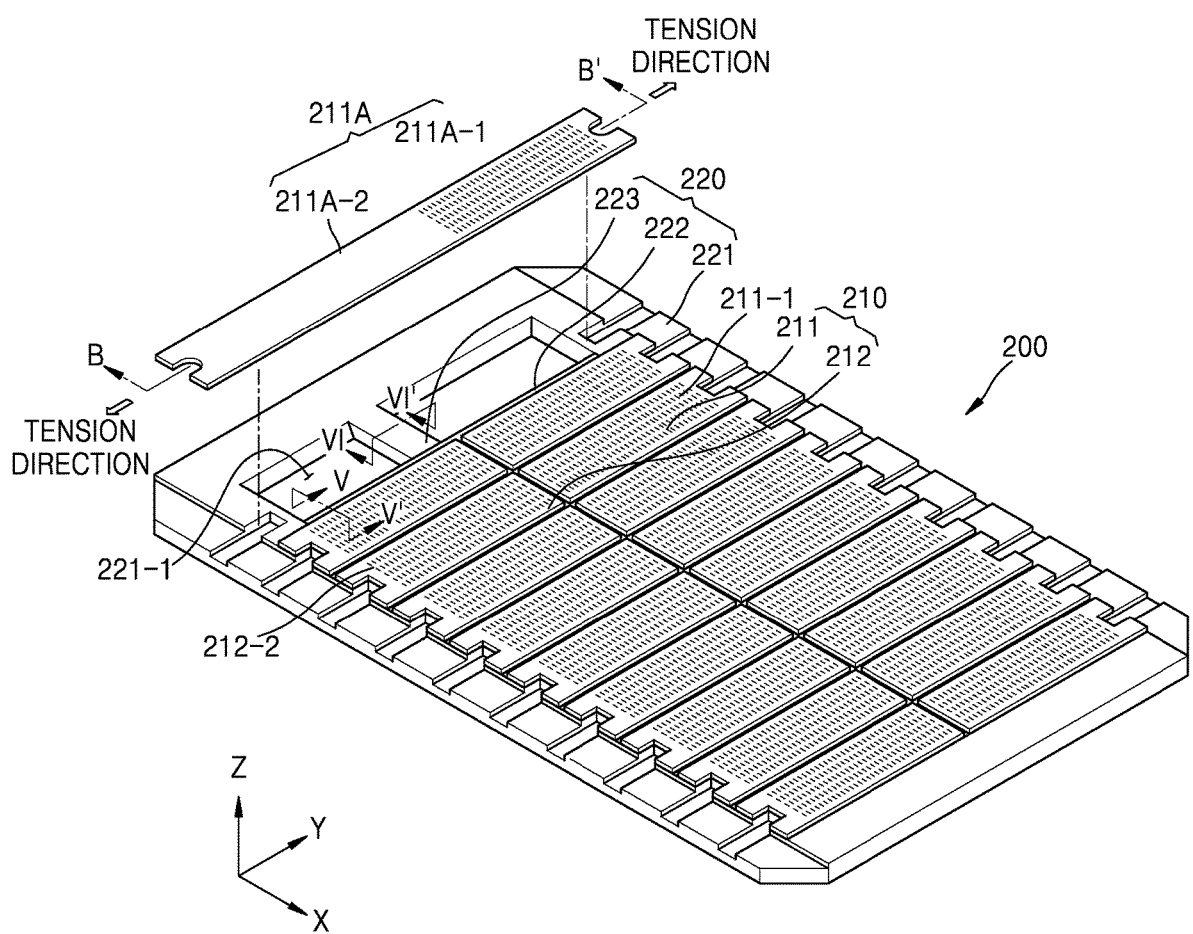
FIG. 4 is a perspective view of a mask assembly shown in FIG. 1.
Figure 5:
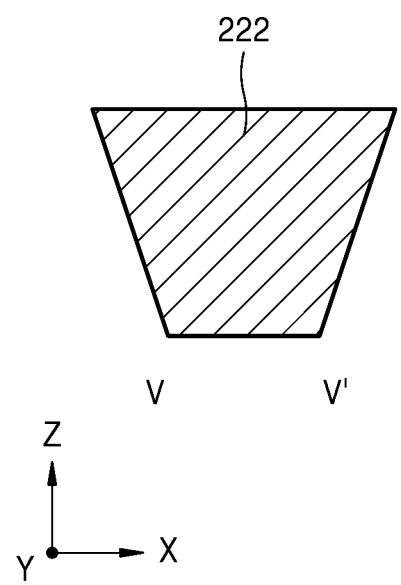
FIG. 5 is a cross-sectional view of the mask assembly of FIG. 4, taken along the line V-V'.

FIG. 4 is a perspective view of the mask assembly 20; FIG. 5 is a cross-sectional view of the mask assembly 200 taken along the line V-V of FIG. 4; and FIG. 6 is a cross-sectional view of the mask assembly 200 taken along the line VI-VI' of FIG. 4.

Figure 6:
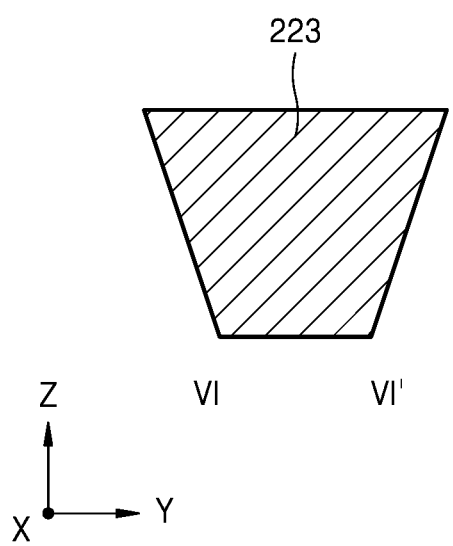
FIG. 6 is a cross-sectional view of the mask assembly of FIG. 4, taken along the line VI-VI'.

Referring to FIGS. 4 to 6, the mask assembly 200 may include the mask frame 220 and the mask sheet 210.

The mask frame 220 may include a frame body portion 221 and dividers 222 and 223.

In an embodiment, the frame body portion 221 may include a plurality of frames connected to each other. In an embodiment, the plurality of frames may configure a quadrangular shape. The frame body portion 221 may include a frame opening in a central portion thereof. In an embodiment, the frame opening of the frame body portion 221 may have a quadrangular shape. For example, the frame opening (not shown) of the frame body portion 221 may have a rectangular shape or a square shape. In an embodiment, a border of the frame body portion 221 may have a quadrangular shape, and the border of the frame body portion 221 may have a long side and a short side. For example, a long side of the frame body portion 221 may be arranged in an X-direction of FIG. 4, and a short side of the frame body portion 221 may be arranged in a Y-direction of FIG. 4.

The dividers 222 and 223 may be arranged in the frame opening of the frame body portion 221 to divide the frame opening of the frame body portion 221 into a plurality of openings 221-1. The dividers 222 and 223 may be provided as a plurality of dividers such that the dividers 222 and 223 are arranged in a first direction and a second direction that are different directions. The dividers 222 and 223 may include a first divider 222 and a second divider 223, the first divider 222 being arranged in the first direction (e.g. the Y-direction of FIG. 4), and the second divider 223 being arranged in the second direction (e.g. the X-direction of FIG. 4). In an embodiment, the first divider 222 and the second divider 223 may be formed as one body with the frame body portion 221. The first divider 222 and the second divider 223 may be arranged to intersect each other and be connected to each other. The mask frame 220 may be manufactured through milling, casting, etc.

The first divider 222 and the second divider 223 may support the frame body portion 221 to prevent or substantially prevent transformation of the mask frame 220. An opening 221-1 formed by the first divider 222 and the second divider 223 each dividing the frame opening of the frame body portion 221 may correspond to the display area of the display device. The first divider 222 and the second divider 223 may divide the frame opening of the frame body portion 221 into a plurality of openings 221-1 and thus guide the deposition material such that the deposition material corresponds to a plurality of display areas through one mask assembly 200.

In an embodiment, a lateral side of at least one of the first divider 222 and the second divider 223 may be tapered. Herein, for convenience of description, a case in which a lateral side of the first divider 222 and a lateral side of the second divider 223 are tapered is mainly described in further detail.

In an embodiment, a width of one of a top surface and a bottom surface of the first divider 222 may be less than the other of the top surface and the bottom surface of the first divider 222. In an embodiment, a width of the top surface of the first divider 222 may be greater than a width of the bottom surface of the first divider 222. In this case, the top surface of the first divider 222 may be a surface arranged on a top portion of FIG. 5 (or a surface of the first divider 222 facing the display substrate D of FIG. 1), and the bottom surface of the first divider 222 may be a surface arranged on a bottom portion of FIG. 5 (or a surface of the first divider 222 facing the deposition source 160 of FIG. 1). In addition, a width of the first divider 222 may be measured in a direction (e.g. the X-direction of FIG. 4) perpendicular to a lengthwise direction (e.g. the Y-direction of FIG. 4) of the first divider 222.

The second divider 223 may be formed the same as or similar to the first divider 222. In an embodiment, a width of a top surface of the second divider 223 may be greater than a width of a bottom surface of the second divider 223. In this case, a lateral side of the second divider 223 may be inclined from the top surface of the second divider 223 to the bottom surface of the second divider 223. An angle formed by the lateral side of the second divider 223 and the bottom surface of the second divider 223 may be an obtuse angle exceeding 90°, and an angle formed by the lateral side of the second divider 223 and the top surface of the second divider 223 may be an acute angle less than 90° and greater than 0°.

A number of first dividers 222 and a number of second dividers 223 may be varied depending on a number of openings 221-1. For example, in an embodiment, the first divider 222 may be provided as a plurality of first dividers, and the second divider 223 may be provided as one divider. In this case, the openings 221-1 may be provided as two openings in the first direction and provided as at least three openings in the second direction. In another embodiment, one first divider 222 may be provided and a plurality of second dividers 223 may be provided. In this case, the openings 221-1 may be provided as at least three openings in the first direction and provided as two openings in the second direction. In another embodiment, both the first divider 222 and the second divider 223 may be provided as a plurality of dividers. In this case, the openings 221-1 may be provided as at least three openings in each of the first direction and the second direction. In another embodiment, one first divider 222 and one second divider 223 may be provided. In this case, the openings 221-1 may be provided as two openings in each of the first direction and the second direction. Herein, for convenience of description, a case in which the first divider 222 is provided as a plurality of dividers and the second divider 223 is provided as one divider is mainly described in further detail.

The plurality of first dividers 222 may be apart from each other in the second direction. In this case, each first divider 222 may be arranged between two first mask sheets 211 that neighbor each other among a plurality of first mask sheets 211.

The mask sheet 210 may include the first mask sheet 211 and the second mask sheet 212 arranged on the mask frame 220.

In an embodiment, at least one of the first mask sheet 211 and the second mask sheet 212 may shield at least one of the plurality of openings 221-1. For example, in a case in which the openings 221-1 are provided as at least three openings in the first direction, at least one of the first mask sheet 211 and the second mask sheet 212 may shield two or more openings 221-1 among the at least three openings 221-1 provided in the first direction. In another embodiment, in a case in which the openings 221-1 are provided as at least two openings in the second direction, at least one of the first mask sheet 211 and the second mask sheet 212 may shield two or more openings 221-1 among the at least two openings 221-1 provided in the second direction. Herein, for convenience of description, a case in which each of the first mask sheet 211 and the second mask sheet 212 shields one of the plurality of openings 221-1 is mainly described in further detail.

In an embodiment, the first mask sheet 211 and the second mask sheet 212 may be arranged in a line in the first direction. For example, the first mask sheet 211 and the second mask sheet 212 may be arranged in a line in a short side direction (e.g. the Y-direction of FIG. 4) of the frame body portion 221. In an embodiment, the first mask sheet 211 and the second mask sheet 212 may be provided as a plurality of mask sheets. In an embodiment, the plurality of first mask sheets 211 may be arranged in a line in the second direction, and the plurality of second mask sheets 212 may be arranged in a line in the second direction. For example, the plurality of first mask sheets 211 each may be arranged to neighbor each other in a long side direction (e.g. the X-direction of FIG. 4) of the frame body portion 221, and the plurality of second mask sheets 212 each may be arranged to neighbor each other in the long side direction of the frame body portion 221. In an embodiment, since the first mask sheet 211 is the same as or similar to the second mask sheet 212, the first mask sheet 211 is mainly described below in further detail.

The first mask sheet 211 is arranged and fixed on a top surface of the mask frame 220. In an embodiment, the first mask sheet 211 may be fixed on the mask frame 220 with tensile force applied thereto.

The first mask sheet 211 may be formed in a stick or bar shape. In an embodiment, the first mask sheet 211 may include a plurality of first mask sheets 211. Each first mask sheet 211 may be arranged on the mask frame 220 such that a short side direction of the mask frame 220 coincides with a lengthwise direction of the first mask sheet 211. The plurality of first mask sheets 211 may be arranged to neighbor each other. The plurality of first mask sheets 211 may be arranged to neighbor each other in a long side direction of the mask frame 220. At least one first pattern opening 211-1 may be arranged in the first mask sheet 211. In an embodiment, in a case in which a plurality of first pattern openings 211-1 are provided, the plurality of first pattern openings 211-1 are apart from each other and respective first pattern openings 211-1 may be uniformly or substantially uniformly arranged in an entire surface of the first mask sheet 211.

In an embodiment, one first mask sheet 211 may correspond to one opening 221-1. In another embodiment, at least two first mask sheets 211 may correspond to one opening 221-1. Herein, for convenience of description, a case in which one first mask sheet 211 corresponds to one opening 221-1 is mainly described in further detail.

In an embodiment, the first mask sheet 211 may be fixed on the mask frame 220 with tensile force applied to the first mask sheet 211. For example, two opposite ends of the first mask sheet 211 may be respectively fixed on the frame body portion 221 and the second divider 223. In another embodiment, in a case in which a plurality of second dividers 223 are provided, two opposite ends of the first mask sheet 211 may be respectively fixed on the second dividers 223 that neighbor each other. Herein, for convenience of description, a case in which two opposite ends of the first mask sheet 211 are respectively fixed on the frame body portion 221 and the second divider 223 is mainly described in further detail.

In an embodiment, the first mask sheet 211 and the second mask sheet 212 are separated from each other and fixed on the mask frame 220 to prevent or substantially prevent the first mask sheet 211 and the second mask sheet 212 from sagging due to weights of the first mask sheet 211 and the second mask sheet 212.

In addition, the first divider 222 and second divider 223 may minimize or reduce transformation of the frame body portion 221 when heat is applied to the frame body portion 221 through the first divider 222 and the second divider 223.

In an embodiment, the first mask sheet 211 may be installed by fixing a first mask sheet member 211A on the mask frame 220. The first mask sheet member 211A may include a first pattern portion 211A-1 and a first shield portion 211A-2, and the first pattern opening 211-1 may be arranged in the first pattern portion 211A-1. In an embodiment, the first mask sheet 211 may be formed by fixing a portion of the first mask sheet 211 on the mask frame 220 and then removing the first shield portion 211A-2. The second mask sheet 212 may be formed by using a method similar to a method of forming the first mask sheet 211.

Therefore, transformation of the mask assembly 200 due to external heat may be minimized or reduced. In addition, transformation of the mask assembly 200 due to weight of each mask sheet may be minimized or reduced.

In a case in which a plurality of display devices are manufactured by using one mother material, since the transformation of the mask assembly 200 may be minimized or reduced, a size of the mask assembly 200 may be increased to correspond to a size of the mother material.

Figure 7:
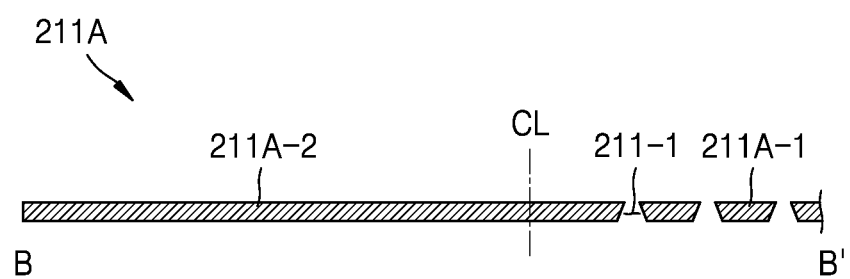
FIG. 7 is a cross-sectional view of a first mask sheet member of FIG. 4 according to an embodiment, taken along the line B-B'.

FIG. 7 is a cross-sectional view of an embodiment of the first mask sheet member 211A taken along the line B-B' of FIG. 4.

Referring to FIG. 7, the first mask sheet member 211A may be fixed on the mask frame (not shown) to constitute the first mask sheet 211. In an embodiment, the first mask sheet member 211A may include the first shield portion 211A-2 and the first pattern portion 211A-1. At least one first pattern opening 211-1 may be arranged in the first pattern portion 211A-1. The first shield portion 211A-2 may be a region in which the first pattern opening 211-1 is not arranged. In an embodiment, the first shield portion 211A-2 may have a plate shape in which there is no opening. In an embodiment, a thickness of the first shield portion 211A-2 may be equal to a thickness of the first pattern portion 211A-1, and a top surface of the first shield portion 211A-2 and a top surface of the first pattern portion 211A-1 may be arranged on a same plane, and a bottom surface of the first shield portion 211A-2 and a bottom surface of the first pattern portion 211A-1 may be arranged on a same plane.

In an embodiment, a first cutting line CL may be between the first shield portion 211A-2 and the first pattern portion 211A-1. In this case, a groove or a virtual line serving as a reference of the first cutting line CL may be formed.

The first cutting line CL may serve as a reference line separating the first shield portion 211A-2 from the first pattern portion 211A-1 after the first mask sheet member 211A is fixed on the mask frame 220. In an embodiment, a laser may be irradiated or physical force, such as a cutting wheel, may be applied to the first cutting line CL.

Figure 8:
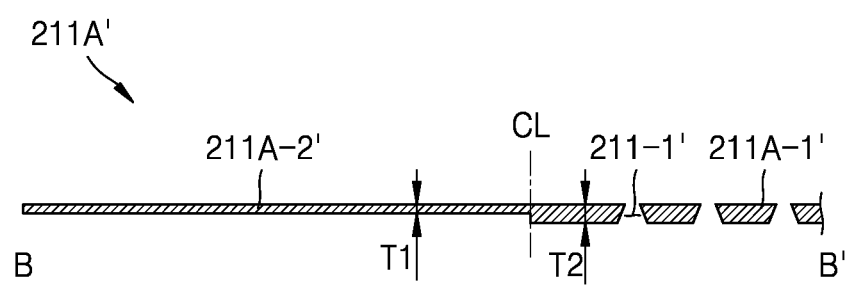
FIG. 8 is a cross-sectional view of a first mask sheet member according to another embodiment, taken along a line corresponding to the line B-B' of FIG. 4.

FIG. 8 is a cross-sectional view of a first mask sheet member 211A' according to another embodiment, taken along a line corresponding to the line B-B' of FIG. 4.

Referring to FIG. 8, the first mask sheet member 211A' may include a first shield portion 211A-2' and a first pattern portion 211A-1'. In an embodiment, the first pattern portion 211A-1' may be the same as that described with reference to FIG. 7, and a first pattern opening 211-1' may be arranged in the first pattern portion 211A-1'.

The first shield portion 211A-2' may be connected to the first pattern portion 211A-1' and formed as one body with the first pattern portion 211A-1'. In an embodiment, a first cutting line CL may be formed or arranged between the first shield portion 211A-2' and the first pattern portion 211A-1'.

A thickness T1 of the first shield portion 211A-2' may be different from a thickness T2 of the first pattern portion 211A-1'. In an embodiment, the thickness T1 of the first shield portion 211A-2' may be less than the thickness T2 of the first pattern portion 211A-1'. In an embodiment, a top surface of the first shield portion 211A-2' and a top surface of the first pattern portion 211A-1' may be arranged on different planes, and a bottom surface of the first shield portion 211A-2' and a bottom surface of the first pattern portion 211A-1' may be arranged on a same plane. In another embodiment, the top surface of the first shield portion 211A-2' and the top surface of the first pattern portion 211A-1' may be arranged on a same plane, and the bottom surface of the first shield portion 211A-2' and the bottom surface of the first pattern portion 211A-1' may be arranged on different planes. In another embodiment, the top surface of the first shield portion 211A-2' and the top surface of the first pattern portion 211A-1' may be arranged on different planes, and/or the bottom surface of the first shield portion 211A-2' and the bottom surface of the first pattern portion 211A-1' may be arranged on different planes. Herein, for convenience of description, a case in which the top surface of the first shield portion 211A-2' and the top surface of the first pattern portion 211A-1' are arranged on a same plane, and the bottom surface of the first shield portion 211A-2' and the bottom surface of the first pattern portion 211A-1' are arranged on different planes is mainly described in further detail.

In an embodiment, in a case in which the thickness T1 of the first shield portion 211A-2' is different from the thickness T2 of the first pattern portion 211A-1', when the first mask sheet member 211A' is tensioned, an entire surface of the first mask sheet member 211A' may be uniformly or substantially uniformly transformed. That is, if a first pattern opening is arranged in a first pattern portion, the first pattern portion may be more transformed than a first shield portion. However, as described above, in an embodiment in which the thickness T1 of the first shield portion 211A-2' is less than the thickness T2 of the first pattern portion 211A-1, since the first shield portion 211A-2' is more easily transformed, when the first mask sheet member 211A' is tensioned, the first shield portion 211A-2' may be transformed similar to the first pattern portion 211A-1'.

FIGS. 9 to 14 are plan views illustrating a method of manufacturing a mask assembly, such as the mask assembly shown in FIG. 4, according to an embodiment.

Figure 9:
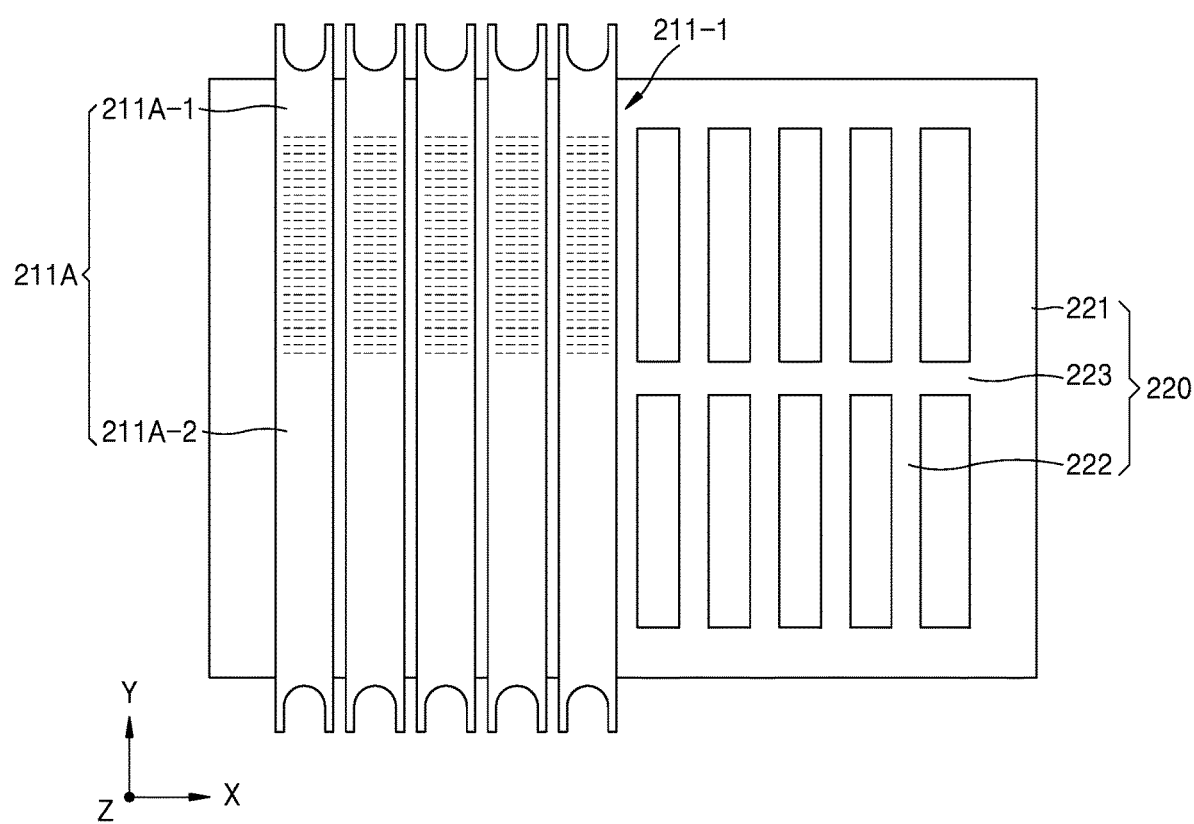
FIGS. 9 to 14 are plan views illustrating a method of manufacturing the mask assembly shown in FIG. 4 according to an embodiment.

Referring to FIG. 9, the mask frame 220 is manufactured and prepared, and then the first mask sheet member 211A may be arranged and fixed on the mask frame 220. In an embodiment, a lateral side of at least one of the first divider 222 and the second divider 223 of the mask frame 220 may be manufactured in a tapered shape.

The first mask sheet member 211A may be arranged on the mask frame 220 with the first mask sheet member 211A tensioned in a lengthwise direction (e.g. the first direction, the short side direction of the frame body portion 221) of the first mask sheet member 211A.

In an embodiment, one first mask sheet member 211A may be arranged on the mask frame 220. In another embodiment, the plurality of first mask sheet members 211A may be arranged on the mask frame 220 while the plurality of first mask sheet members 211A are concurrently (e.g., simultaneously) tensioned. For convenience of description, the plurality of first mask sheet members 211A may be concurrently (e.g., simultaneously) arranged on the mask frame 220 while the plurality of first mask sheet members 211A are tensioned.

In an embodiment, though not shown in FIG. 9, two opposite ends of the first mask sheet member 211A may be gripped and drawn by using a clamp, etc.

Though it is shown in FIG. 9 that the plurality of first mask sheet members 211A is arranged on a portion of the mask frame 220, in an embodiment, the plurality of first mask sheet members 211A may be arranged to cover an entire surface of the mask frame 220. Herein, for convenience of description, a case in which the plurality of first mask sheet members 211A is arranged on a portion of the mask frame 220 is mainly described in further detail.

When the first mask sheet member 211A is arranged, the first pattern portion 211A-1 may be arranged to correspond to the opening of the frame body portion 221, and the first shield portion 211A-2 may be arranged to correspond to another opening of the frame body portion 221. In an embodiment, the cutting line (not shown) arranged between the first shield portion 211A-2 and the first pattern portion 211A-1 may be arranged on the second divider 223. The first divider 222 may be arranged between the first mask sheet members 211A that neighbor each other.

Figure 10:
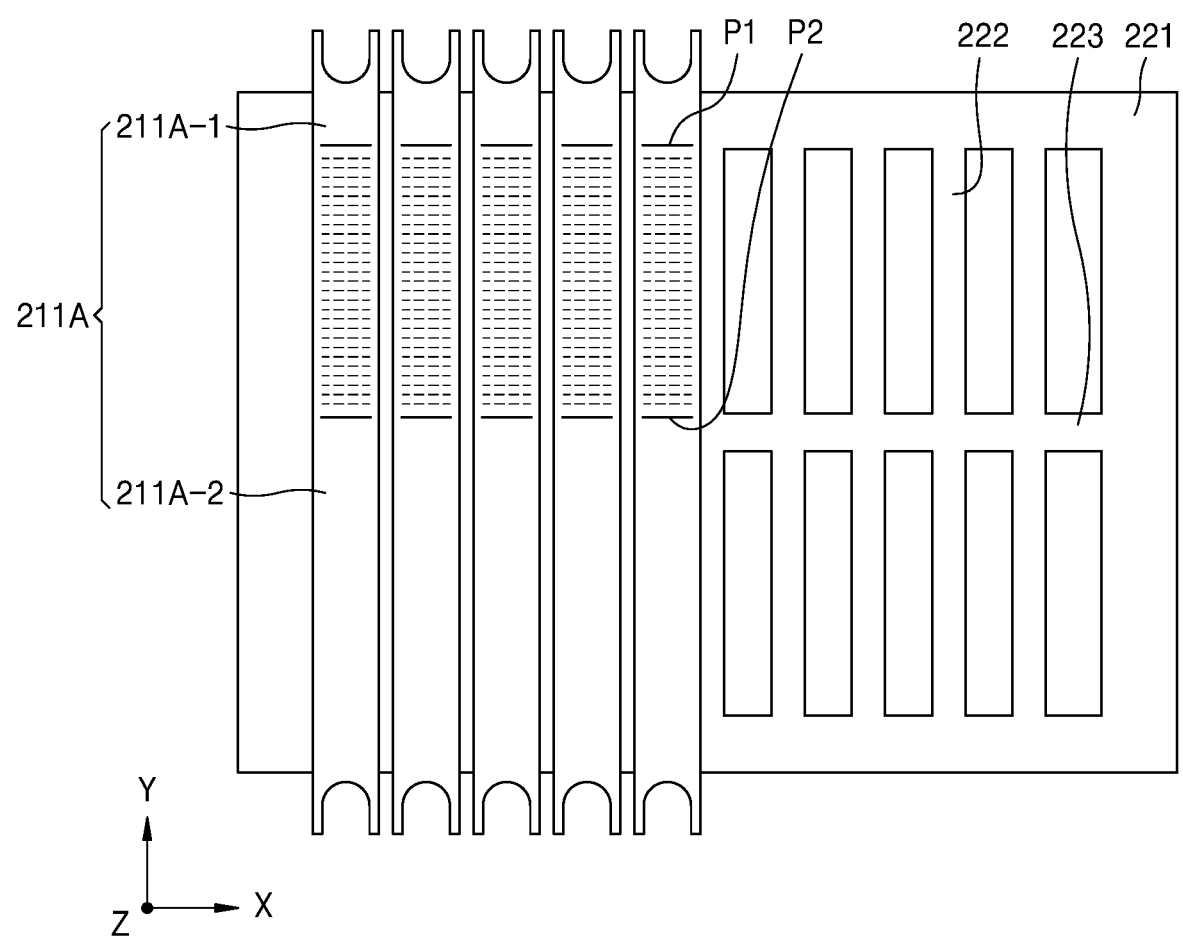

Referring to FIG. 10, the first mask sheet member 211A is completely arranged, and then the first mask sheet member 211A may be fixed on the mask frame 220 through welding. In an embodiment, ends of the first pattern portion 211A-1 are welded on the frame body portion 221, and the second divider 223 may be welded between the first pattern portion 211A-1 and the first shield portion 211A-2. In an embodiment, a first welding point or line P1 may be arranged on the first pattern portion 211A-1, and a second welding point or line P2 may be arranged between the first pattern portion 211A-1 and the first shield portion 211A-2.

In an embodiment, the first pattern portion 211A-1 and the first shield portion 211A-2 may be arranged to shield different openings 221-1.

Figure 11:
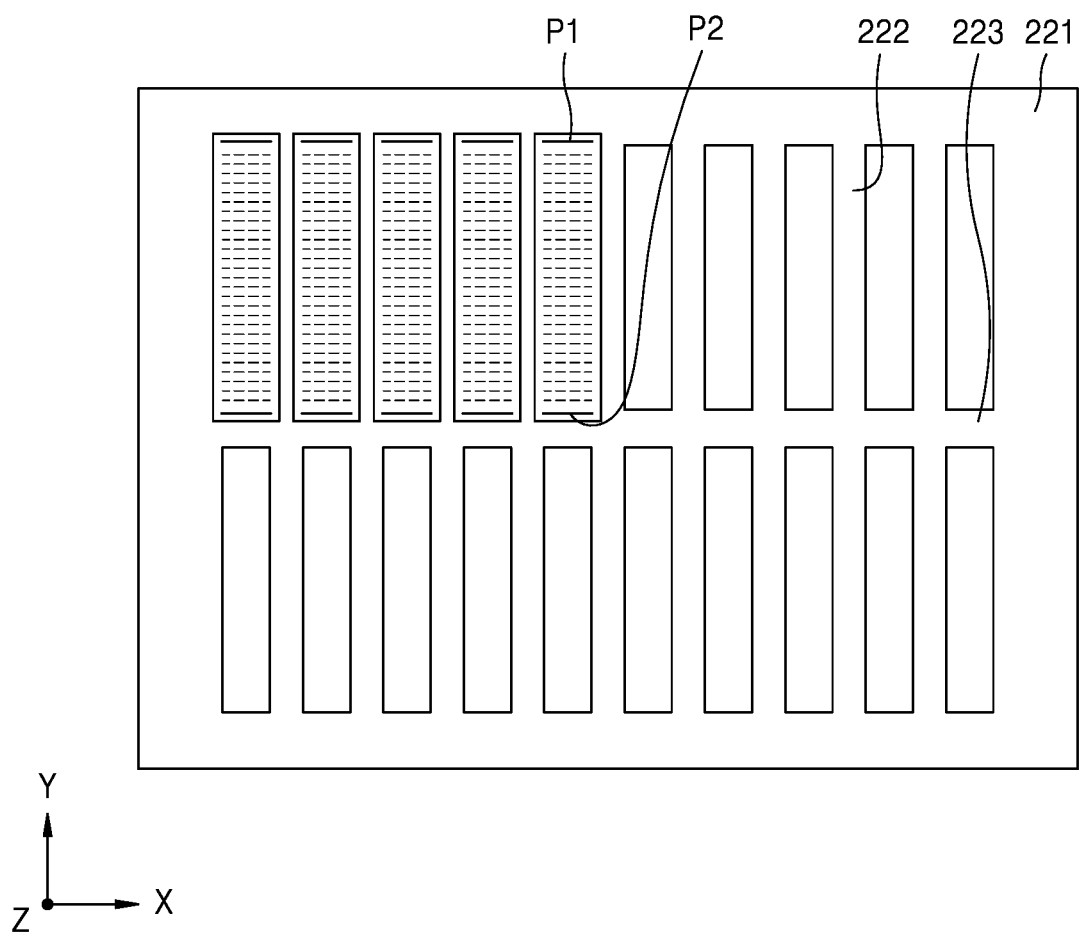

Referring to FIG. 11, the first mask sheet member 211A is fixed on the mask frame 220, and then the first shield portion 211A-2 may be separated from the first pattern portion 211A-1. In an embodiment, though not shown in FIG. 11, the first shield portion 211A-2 may be separated from the first pattern portion 211A-1 by removing a portion of the first mask sheet member 211A along the cutting line (not shown) between the first shield portion 211A-2 and the first pattern portion 211A-1 by using a laser or a cutting wheel.

Figure 12:
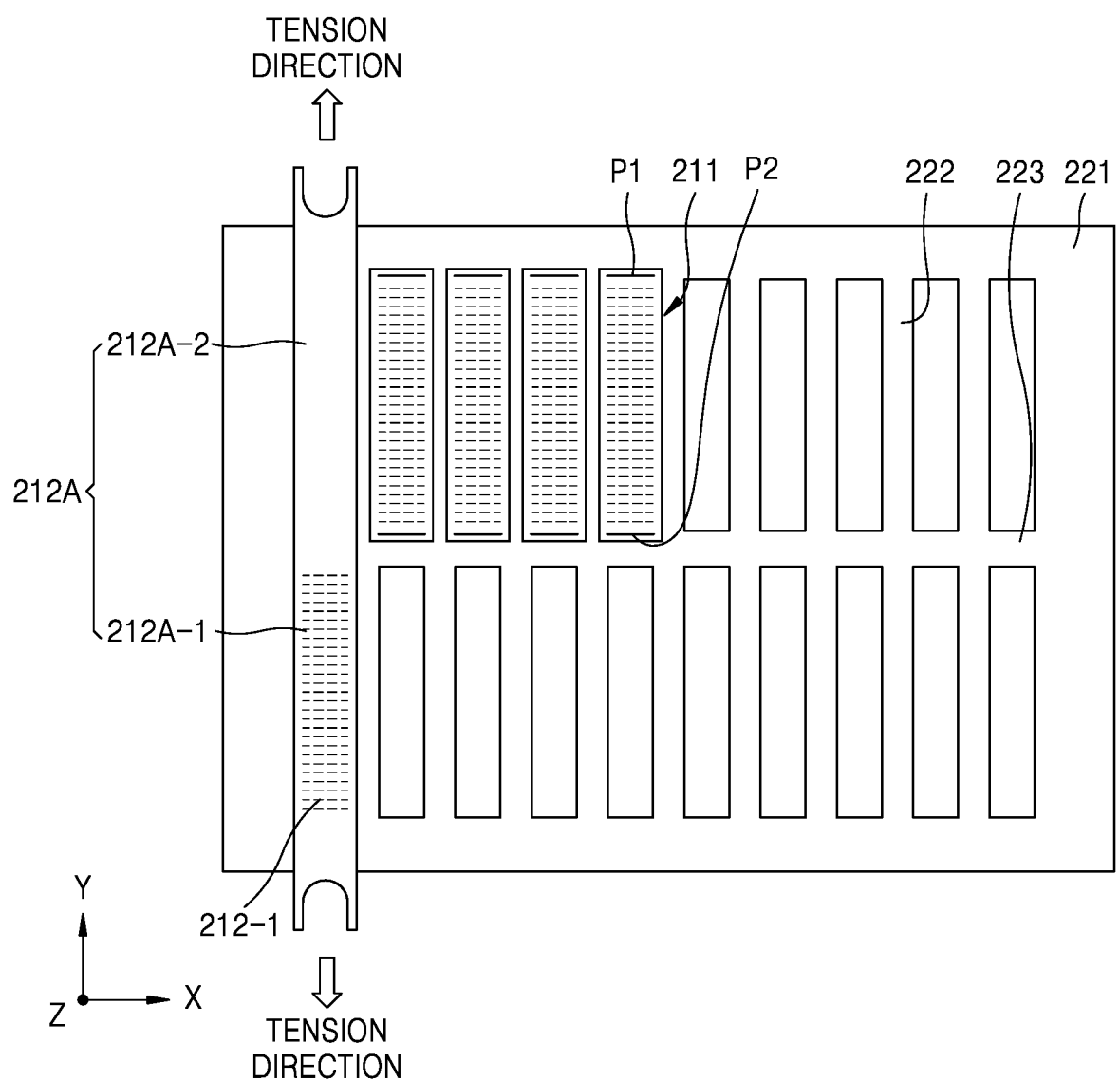

Referring to FIG. 12, the first mask sheet 211 may be formed by removing the first shield portion 211A-2 from the first mask sheet member 211A and leaving only the first pattern portion 211A-1.

In this case, the first mask sheet 211 is fixed, and then the second mask sheet 212 may be fixed on the mask frame 220 by arranging the second mask sheet member 212A.

The second mask sheet member 212A may be arranged on the mask frame 220. The second shield portion 212A-2 may be arranged to correspond to the first mask sheet 211, and the second pattern portion 212A-1 may be arranged to correspond to the opening 221-1 on which the first mask sheet 211 is not arranged. In an embodiment, in plan view, the second mask sheet member 212A may completely shield the first mask sheet 211. Similar to the first mask sheet member 211A, the second mask sheet member 212A may be arranged with tensile force applied thereto.

Figure 13:
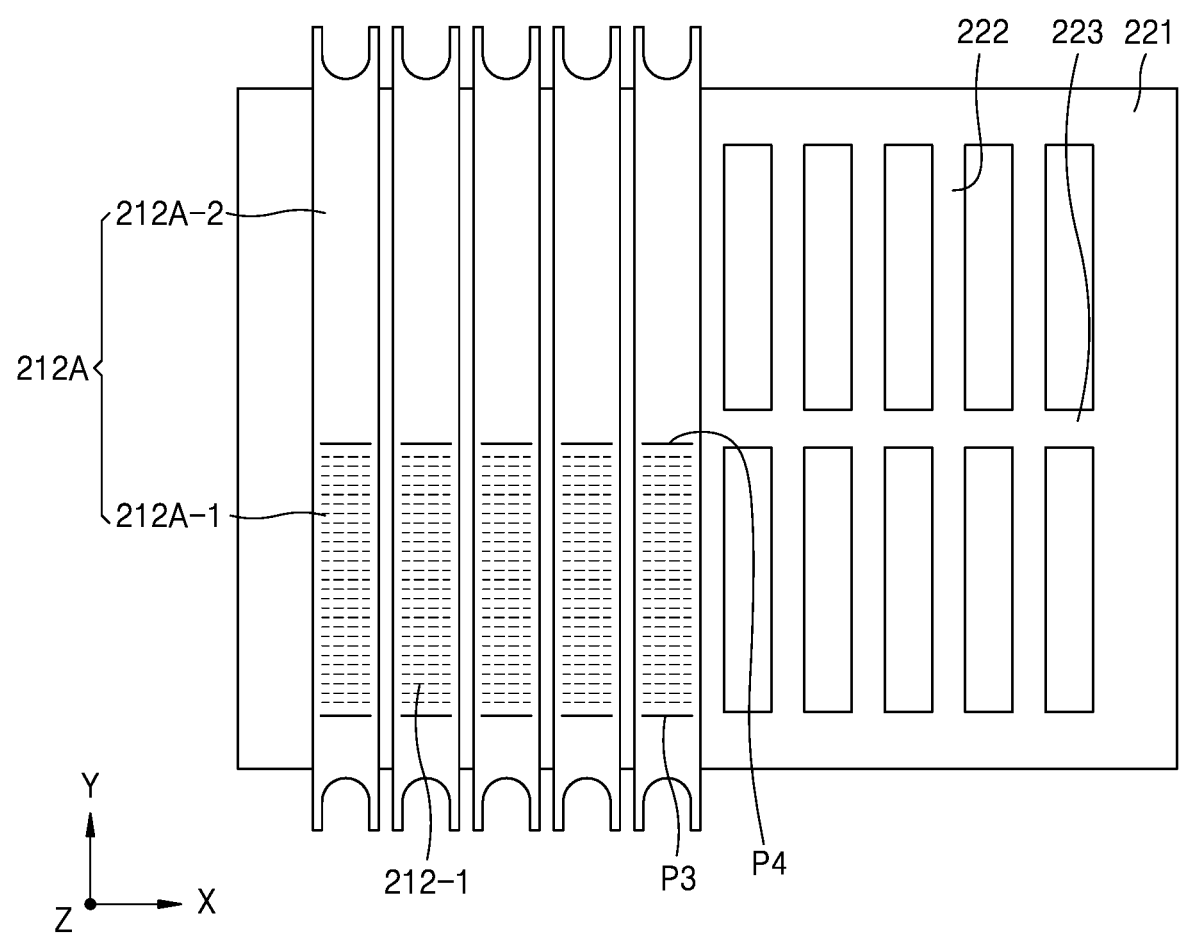

Referring to FIG. 13, the second mask sheet member 212A is arranged on the mask frame 220, and then the second mask sheet member 212A may be fixed on the mask frame 220.

In an embodiment, ends of the second pattern portion 212A-1 are welded on the frame body portion 221, and the second divider 223 may be welded between the second pattern portion 212A-1 and the second shield portion 212A-2. In an embodiment, the welding method may be performed by using a laser or arc welding.

In an embodiment, a third welding point or line P3 may be arranged on the second pattern portion 212A-1, and a fourth welding point or line P4 may be arranged between the second pattern portion 212A-1 and the second shield portion 212A-2. In an embodiment, the fourth welding point P4 may not overlap the second welding point P2.

Figure 14:
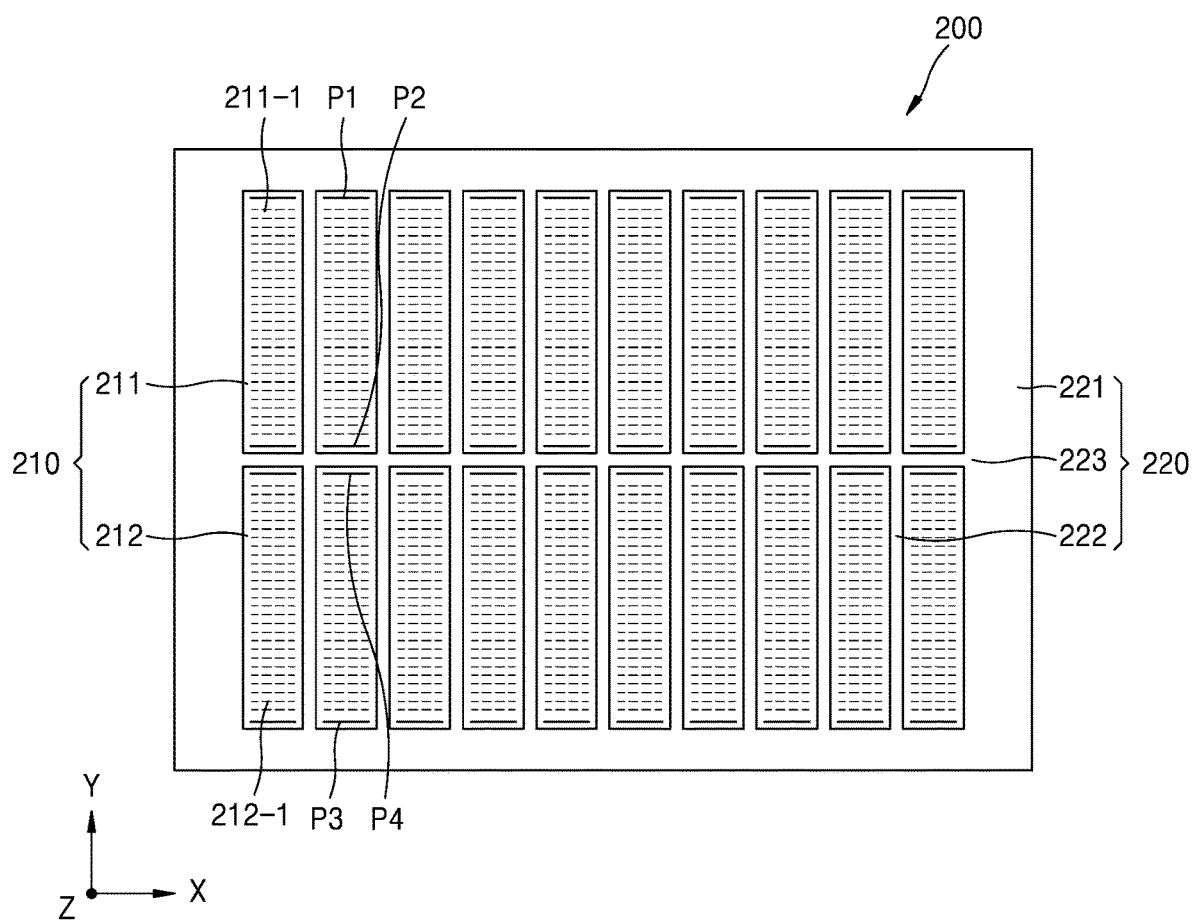

Referring to FIG. 14, the second mask sheet member 212A is fixed on the mask frame 220, and then the second pattern portion 212A-1 may be completely fixed on the mask frame 220 by removing the second shield portion 212A-2. In this case, the second pattern portion 212A-1 may be the second mask sheet 212.

An end of the first mask sheet 211 arranged on the second divider 223 may meet or may be apart from an end of the second mask sheet 212 arranged on the second divider 223. In an embodiment, since the second welding point P2 does not overlap the fourth welding point P4, the first mask sheet 211 and the second mask sheet 212 may not be floated from the second divider 223.

The above process may be repeatedly performed such that all openings 221-1 of the mask frame 220 are shielded.

Figure 15:
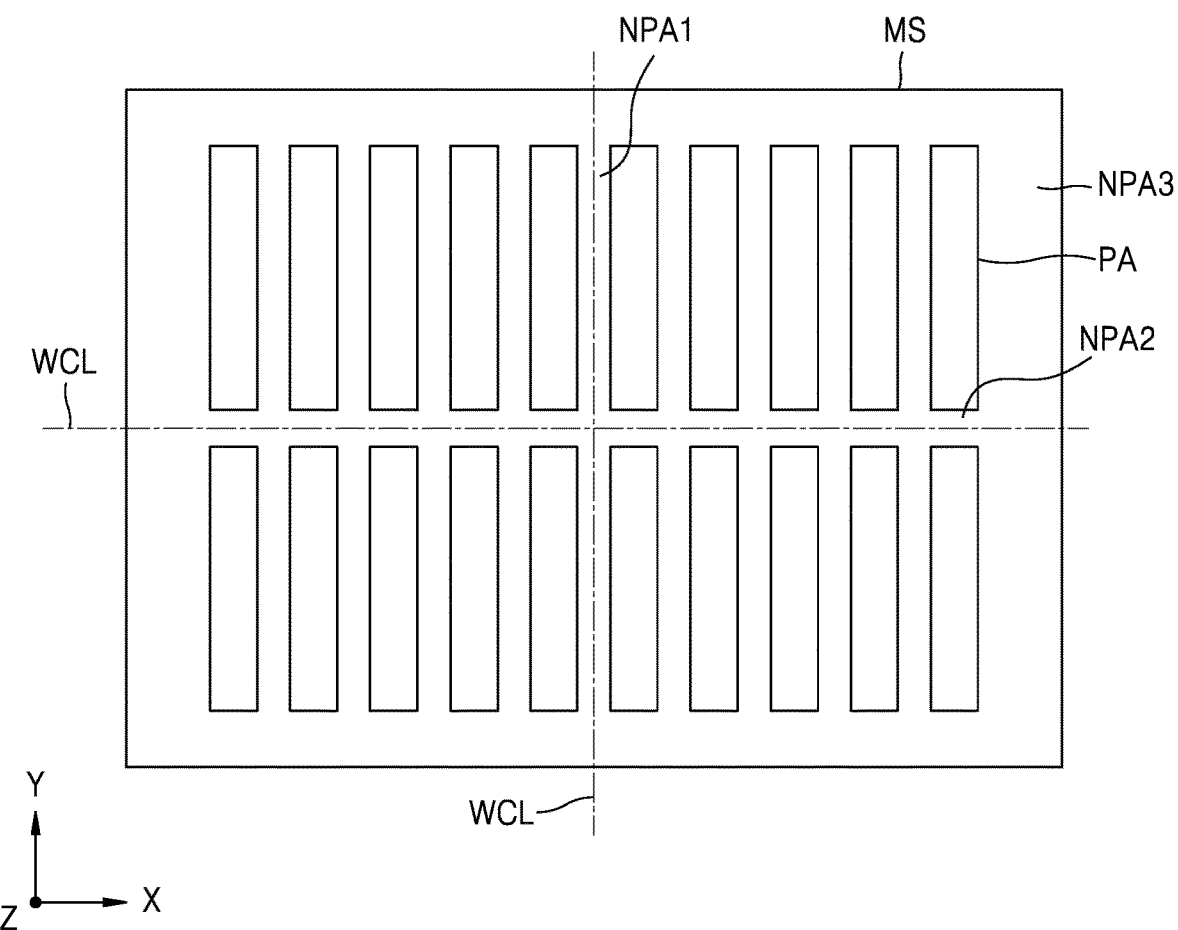
FIG. 15 is a plan view of a display device manufactured by using an apparatus for manufacturing the display device according to an embodiment.

FIG. 15 is a plan view of a display device manufactured by using an apparatus for manufacturing a display device according to an embodiment, such as the apparatus shown in FIG. 1.

Referring to FIG. 15, the display device (not shown) may be manufactured by stacking respective layers shown in FIG. 2 on a mother substrate MS. In an embodiment, one mother substrate MS may be used to manufacture one display device. In another embodiment, one mother substrate MS may be used to manufacture a plurality of display devices. In this case, the plurality of display devices may be manufactured by stacking the respective layers shown in FIG. 2 in a plurality of regions separated from each other, and separating the regions from each other.

In an embodiment, the mother substrate MS may include a cell area PA, a first non-deposition area NPA1, a second non-deposition area NPA2, and a third non-deposition area NPA3, respective layers being stacked in the cell area PA, and the non-deposition areas NPA1, NPA2, and NPA3 surrounding the cell area PA.

In an embodiment, the respective layers of FIG. 2 described above may be stacked on the mother substrate MS in the cell area PA, and separate other layers except the encapsulation member may not be arranged in the first non-deposition area NPA1, the second non-deposition area NPA2, and the third non-deposition area NPA3. In another embodiment, the respective layers of FIG. 2 described above may be stacked on the mother substrate MS in the cell area PA. Separate other layers of FIG. 2 except the encapsulation member and the pad unit may not be arranged in the first non-deposition area NPA1, the second non-deposition area NPA2, and the third non-deposition area NPA3.

In an embodiment, the first non-deposition area NPA1, the second non-deposition area NPA2, and the third non-deposition area NPA3 may be connected to one another. In addition, the first non-deposition area NPA1 and the second non-deposition area NPA2 may be arranged in the third non-deposition area NPA3 to divide the mother substrate MS inside the third non-deposition area NPA3 into a plurality of cell areas PA. At least one of the first non-deposition area NPA1 and the second non-deposition area NPA2 may be separated afterward to separate the plurality of cell areas PA from each other. In this case, the first non-deposition area NPA1 may correspond to the first divider (not shown) described above, and the second non-deposition area NPA2 may correspond to the second divider 223 described above.

Layers except the substrate 21 shown in FIG. 2 may be stacked on the mother substrate MS in the cell area PA.

A method of manufacturing the plurality of display devices by using the mother substrate MS is described. In an embodiment, a side of the mother substrate MS is washed by using a washing liquid, and then the layers except the substrate 21 shown in FIG. 2 may be sequentially stacked in the regions of the mother substrate MS that are apart from each other.

The pixel electrode (not shown) is formed on the mother substrate MS, and then at least one layer of the intermediate layer (not shown) may be formed by using the apparatus 100 for manufacturing the display device shown in FIG. 1. In an embodiment, the mask assembly 200 shown in FIG. 4 is used, and the intermediate layer may not be formed in the first non-deposition area NPA1, the second non-deposition area NPA2, and the third non-deposition area NPA3. Also, when the intermediate layer is formed on the mother substrate MS, an apparatus for manufacturing another display device may arrange the opposite electrode (not shown) and the encapsulation member. In this case, as described above, the plurality of cell areas PA may be arranged on the mother substrate MS.

The plurality of display devices may be manufactured by forming a touch electrode layer, a protective layer, etc. on the encapsulation member and then cutting the mother substrate MS. In an embodiment, the mother substrate MS may be cut along a second cutting line WCL passing through centers of the first non-deposition area NPA1 and the second non-deposition area NPA2. The second cutting line WCL may be arranged or formed between the cell areas PA that neighbor each other. In an embodiment, the cut mother substrate MS may include one cell area PA, and an unnecessary portion may be removed from the cut mother substrate MS or the cut mother substrate MS itself may be used as the substrate.

In a case in which at least one layer of the intermediate layer is formed, the at least one layer of the intermediate layer that is formed in the cell area PA may have a fine pattern. In an embodiment, the mask assembly used for forming at least one layer of the intermediate layer may include the first mask sheet and the second mask sheet, thereby minimizing or reducing the transformation of each mask sheet. Since the mask assembly may prevent or substantially prevent the transformation of the mask frame, the deposition material may be deposited on the mother substrate MS in a fine pattern.

A mask assembly according to embodiments may prevent or substantially prevent a mask sheet from sagging when the mask assembly is used for deposition of a large area. An apparatus for manufacturing a display device and a method of manufacturing a display device according to embodiments may manufacture a high-resolution display device by depositing a deposition material in a fine pattern.

It is to be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as set forth by the following claims.

What is claimed is:

1. A method of manufacturing a display device, the method comprising:
arranging a mask frame comprising a frame body portion and dividers, the frame body portion being arranged at an outside of the mask frame, and the dividers dividing an inside of the frame body portion into a plurality of openings, each of the dividers being connected in a first direction and a second direction;
arranging a first mask sheet member on the mask frame, the first mask sheet member comprising a first shield portion, and a first pattern portion in which at least one first pattern opening is arranged;
fixing the first shield portion and the first pattern portion on the mask frame;
removing the first shield portion;
arranging a second mask sheet member comprising a second shield portion, and a second pattern portion in which at least one second pattern opening is arranged, such that the first pattern portion corresponds to the second shield portion, and the second pattern portion corresponds to the first shield portion;
fixing the second shield portion and the second pattern portion on the mask frame; and
removing the second shield portion.

2. The method of claim 1, further comprising tensioning the first mask sheet member in a lengthwise direction of the first mask sheet member.

3. The method of claim 1, further comprising tensioning the second mask sheet member in a lengthwise direction of the second mask sheet member.

4. The method of claim 1, wherein a lateral side of a divider of the dividers is tapered.

5. The method of claim 1, wherein a width of one of a top surface and a bottom surface of a divider of the dividers is less than a width of the other of the top surface and the bottom surface of the divider.

6. The method of claim 1, wherein the first pattern portion and the second pattern portion are arranged in a line in the first direction.

7. The method of claim 1, wherein the first pattern portion comprises a plurality of first pattern portions, and the first mask sheet member is fixed on the mask frame such that the plurality of first pattern portions neighbor each other in the second direction.

8. The method of claim 1, wherein the second pattern portion comprises a plurality of second pattern portions, and the second mask sheet member is fixed on the mask frame such that the plurality of second pattern portions neighbor each other in the second direction.

9. The method of claim 1, wherein the first mask sheet member is fixed on the mask frame by welding.

10. The method of claim 1, wherein the second mask sheet member is fixed on the mask frame by welding.

* * * * *